United States Patent [19]
Lee et al.

[11] Patent Number: 5,631,575
[45] Date of Patent: May 20, 1997

[54] INTERMEDIATE VOLTAGE SENSOR FOR CMOS CIRCUITS

[75] Inventors: Kuen-Jong Lee; Jing-Jou Tang, both of Tainan, Taiwan

[73] Assignee: National Science Council, Taipei, Taiwan

[21] Appl. No.: 524,848

[22] Filed: Sep. 7, 1995

[51] Int. Cl.[6] .................... H03K 19/0948; H03K 19/00
[52] U.S. Cl. ...................... 326/16; 326/58; 326/60
[58] Field of Search ............................. 326/16, 57–58, 326/59–60, 83

[56] References Cited

U.S. PATENT DOCUMENTS

| | | | |
|---|---|---|---|
| 3,969,633 | 7/1976 | Paluck et al. | 326/58 |
| 4,100,429 | 7/1978 | Adachi | 326/60 |
| 4,808,854 | 2/1989 | Reinagel | 326/59 |
| 5,373,202 | 12/1994 | Armstrong, II | 326/58 |

OTHER PUBLICATIONS

Jing–Jou Tang, Kuen Jong Lee and Bin Da Liu; "Built–in Intermediate Voltage Testing for CMOS Circuits"; European Design and Test Conference (Mar. 8, 1995).

*Primary Examiner*—Edward P. Westin
*Assistant Examiner*—Jon Santamauro
*Attorney, Agent, or Firm*—Bacon & Thomas

[57] ABSTRACT

A built-in intermediate voltage sensor for CMOS circuits comprises a linear inverter, a first voltage control switch, a second voltage control switch, and a buffer. The linear inverter has an input end connected with an input signal under test. The first voltage control switch has a control end and an input end which are connected respectively with the input end and an output end of the linear inverter. The second voltage control switch has a control end and an input end which are connected respectively with the output end and the input end of the linear inverter. The buffer has an input end connected with the output end of the first voltage control switch and the output end of the second voltage control switch. The buffer gives forth an output voltage having a first logic value when the input signal has a voltage value of logic "0" or logic "1". The buffer is further capable of giving forth another output voltage having a second logic value when the input signal has a voltage value intermediate between logic "0" and logic "1".

19 Claims, 1 Drawing Sheet

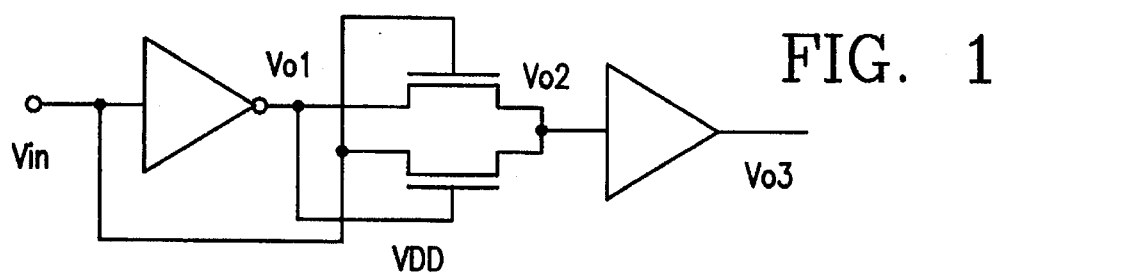
FIG. 1
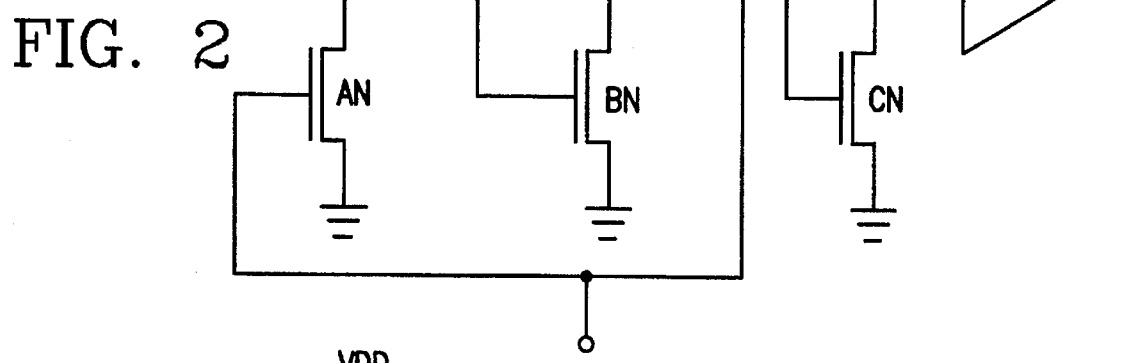
FIG. 2
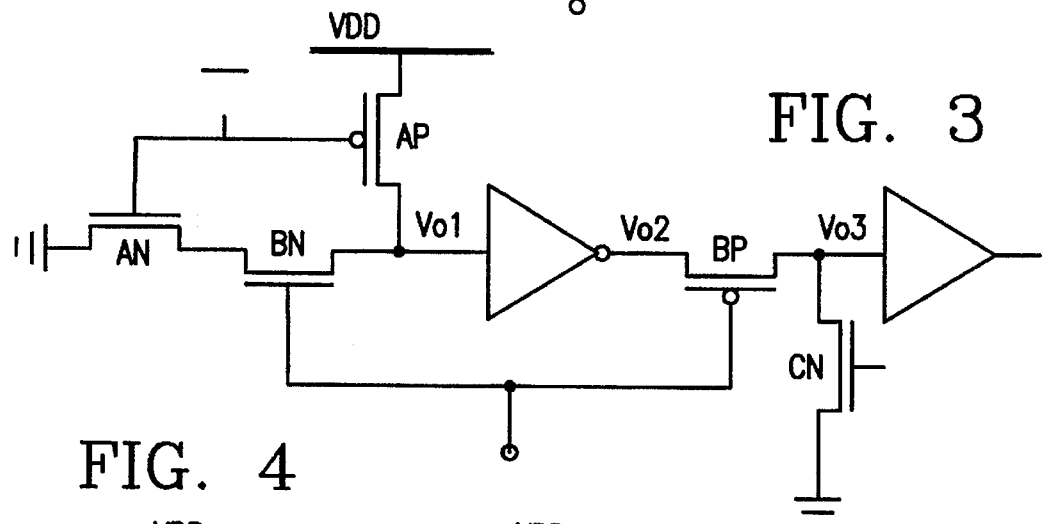
FIG. 3
FIG. 4
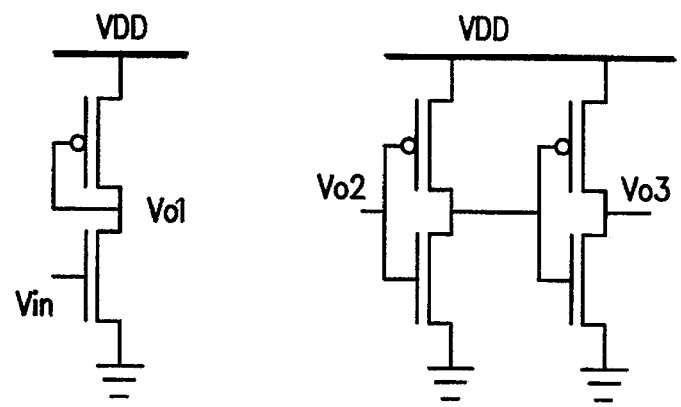
FIG. 5

INTERMEDIATE VOLTAGE SENSOR FOR CMOS CIRCUITS

FIELD OF THE INVENTION

The present invention relates generally to an intermediate voltage sensor for use in a CMOS circuit, and more particularly to a built-in intermediate voltage sensor for the CMOS circuit.

BACKGROUND OF THE INVENTION

The conventional testing method for detecting a fault of a digital circuit is based on logic testing, in which the output logic values of a circuit under test are observed. Such a conventional testing method as described above is incapable of detecting an intermediate fault of the CMOS circuit at such time when the output voltage value is intermediate between $V_{DD}$ (logic 1) and GND (logic 0).

According to a technical proposal disclosed by C. F. Hawkins, et al in their research paper entitled "Quiescent Power Supply Current Measurement for CMOS IC Defect Detection" and published in the May, 1989 issue of IEEE Trans. on Industrial Electronics, such an intermediate fault as described above can be defected by the $I_{DDQ}$ current testing method, which is used in conjunction with some automatic testing equipment (ATE) or built-in current sensors (BICS). However, the employment of automatic testing equipment can result in a substantial reduction in the testing speed and the sensing resolution of the measurable current. On the other hand, the employment of the built-in current sensors can undermine seriously the performance of the circuit under test unless the expensive BiCMOS or dual power supply technique is used. Moreover, the task of designing the CMOS circuits must be carried out in accordance with a specific set of designing rules so as to enable the CMOS circuits to be tested for an intermediate fault by the $I_{DDQ}$ testing method. It must be noted here that the specific set of designing rules is implemented at the expense of the design feasibility of the CMOS circuits.

Another method for testing the intermediate voltage fault was disclosed by G. G. Freeman, et al in their research paper entitled "Two CMOS Metastability Sensors" and published in the 1986 Proceedings of the International Test Conference. This method is based on the theory that the metastability brings about intermediate voltages, which can be therefore detected by the metastability sensors. However, the implementation of the metastability method calls for the employment of a number of complementary input signals. As a result, the metastability method can undermine seriously the performance of the circuit under test.

SUMMARY OF THE INVENTION

It is therefore the primary objective of the present invention to provide an intermediate voltage sensor for CMOS circuits, which is capable of a high-speed testing.

It is another objective of the present invention to provide an intermediate voltage sensor for CMOS circuits, which can be made economically.

It is still another objective of the present invention to provide an intermediate voltage sensor for CMOS circuits, which does not interfere adversely and seriously with the performance of the circuit under test.

In keeping with the principles of the present invention, the foregoing objectives of the present invention are attained by three preferred embodiments, which are merely illustrative and not restrictive.

According to a first preferred embodiment of the present invention, the intermediate voltage sensor for CMOS circuits comprises a linear invertor, a first voltage control switch, a second voltage control switch, and a buffer.

The linear inverter has an input end which is connected with an input signal under test. The linear inverter further has an output end.

The first voltage control switch has a control end and an input end, which are connected respectively with the input end and the output end of the linear inverter. The first voltage control switch further has an output end.

The second voltage control switch has a control end and an input end which are connected respectively with the output end and the input end of the linear inverter. The second voltage control switch further has an output end.

Being opposite in characteristic to the linear inverter, the buffer has an input end which is connected with the output end of the first voltage control switch and the output end of the second voltage control switch.

When the voltage of the input signal under test is a logic value "0" or "1", a first logic voltage is delivered by the buffer. However, when the voltage of the input signal under test is of an intermediate nature, a second logic voltage, which is different from the first logic voltage, is given forth by the buffer.

When the voltage of the input signal under test has a logic value "0" or "1", either the first voltage control switch or the second voltage control switch is connected, depending on which input end has a voltage of logic "0". As a result, the input voltage and the output voltage of the buffer will remain in the state of logic "0". On the other hand, when the voltage of the input signal under test has a logic value which is intermediate between "0" and "1", the inputs and outputs the first voltage control switch and the second voltage control switch will not remain in the state of logic values "0". Thereafter, a voltage of logic "1" is given forth by the buffer which has a precipitous switching characteristic.

It is suggested that the first and the second voltage control switches of the intermediate voltage sensor of the first preferred embodiment of the present invention are preferably MOS transistors, An intermediate voltage sensor of the second preferred embodiment of the present invention comprises a first linear inverter, a second linear inverter, a voltage control switch, and a buffer.

The first linear inverter has an input end which is intended to connect with an input signal under test. The first linear inverter further has an output end.

The second linear inverter has an input end which is connected with the output end of the first linear inverter.

The voltage control switch has a control end, an input end, and an output end. The control end and the input end are connected respectively with the input end of the first linear inverter and the output end of the second linear inverter.

Being opposite in characteristic to the first and the second linear inverters and having a precipitous switching characteristic, the buffer has an input end which is connected with the output end of the voltage control switch.

When the voltage of an input signal under test has a logic value "0" or "1", a first logic voltage is given forth by the buffer. When the voltage of the input signal under test is a fault capable of bringing about an intermediate voltage value, a second logic voltage, which is different from the first logic voltage, is given forth by the buffer.

The voltage control switch of the intermediate voltage sensor of the second preferred embodiment of the present invention can be a negative logic voltage control switch, such as the MOS transistor or more preferably the PMOS transistor.

When the voltage of the input signal under test of the second preferred embodiment of the present invention has a logic value "1", the voltage control switch remains in an "open" state so as to enable the buffer to have an input or output voltage having a logic value "0". On the other hand, when the voltage of the input signal under test has a logic value "0", the output voltages of the first inverter and the second inverter have respectively a logic value "1" and a logic value "0". The voltage control switch remains in a "short" state so as to enable the buffer to have an input or output voltage having a logic value "0". When the voltage of the input signal under test has a logic value which is intermediate between logic "0" and logic "1", the output voltages of the first inverter and the second inverter do not remain respectively in a logic "0" state and a logic "1" state. Thereafter, a voltage having the logic "1" is given forth by the buffer which has a precipitous switching characteristic.

The voltage control switch of the intermediate voltage sensor of the second preferred embodiment of the present invention is preferably the MOS transistor.

An intermediate voltage sensor for CMOS circuits of the third preferred embodiment of the present invention comprises a first positive logic voltage control switch, an inverter, a first negative logic voltage control switch, and a buffer.

The first positive logic voltage control switch has a control end which is connected with an input signal under test. The first positive logic voltage control switch further has an output end.

The inverter has an input end which is connected with the output end of the first positive logic voltage control switch.

The first negative logic voltage control switch has an input end and a control end which are connected respectively with the output end of the inverter and the input signal under test.

The buffer is provided with a precipitous switching characteristic. The buffer has an input end which is connected with the output end of the first negative logic voltage control switch.

When the voltage of the input signal under test is in the logic "0" or "1" state, a first logic voltage is given forth by the buffer. However, when the voltage of the input signal under test is of an intermediate nature, a second logic voltage is given forth by the buffer.

The intermediate voltage sensor of the third preferred embodiment of the present invention further comprises a second negative logic voltage control switch and a second positive logic voltage control switch.

The second negative logic voltage control switch has a control end and an input end, which are connected respectively with a negative logic test signal (TEST) and a power supply signal ($V_{DD}$). The second negative logic voltage control switch further has an output end which is connected with the input end of the inverter for providing the input end of the inverter with a precharged potential.

The second positive logic voltage control switch has a control end and an input end, which are connected respectively with a positive logic test signal (TEST) and a ground end. The second positive logic voltage control switch further has an output end, which is connected with the input end of the buffer for providing the input end of the buffer with a predischarged potential.

The second negative logic voltage control switch and the second positive logic voltage control switch of the intermediate voltage sensor of the third preferred embodiment of the present invention are intended respectively for use in precharging a potential ($V_{O1}$) of the input end of the inverter and predischarging a potential ($V_{O3}$) of the input end of the buffer. The first positive logic voltage control switch and the first negative logic voltage control switch are used to sense the input signal under test. Before the input signal is to be sensed, the "TEST" signal must be set at logic "1". In other words, the intermediate voltage sensor of the present invention is set at the setup phase, in which the potentials ($V_{O1}$ and $V_{O3}$) are preset respectively at logic "1" and logic "0". The "TEST" signal is then set at logic "0" so as to set the intermediate voltage sensor of the present invention at the evaluation phase. If the voltage of the input signal is logic "1", the potential $V_{O3}$ will approach logic "0" in view of the fact that the first negative logic voltage control switch is turned off. As a result, the values of both input voltage and output voltage of the buffer are logic "0". On the other hand, if the voltage value of the input signal to be sensed is logic "0", the potential $V_{O1}$ is kept at logic "1" in view of the fact that the first positive logic voltage control switch is turned off. The values of both input voltage and output voltage of the buffer can be set at logic "0" by setting the potential ($V_{O2}$) of the output end of the inverter at logic "0". When the voltage value of the input signal to be sensed is intermediate between logic "0" and logic "1", the first positive logic voltage control switch and the first negative logic voltage control switch will not be in the logic "0" state and the logic "1" state simultaneously. As a result, the potential $V_{O1}$ is pulled low while the potentials $V_{O2}$ and $V_{O3}$ are pulled high. A voltage having logic "1" is thus given forth by the buffer which has a precipitous switching characteristic.

Preferably, the buffers referred to above in three preferred embodiments of the present invention are composed of two CMOS circuits which are connected in series. In the meantime, the first logic and the second logic values are designated respectively as "0" and "1"

The intermediate voltage sensor for CMOS circuits of the present invention has inherent advantages, which are described explicitly hereinafter.

The sensor of the present invention is capable of a high-speed detection of intermediate faults and is further capable of delivering a sensed result within 4.21 ns. In addition, the sensor of the present invention is so simple in construction that the sensor takes up a relatively small space of an integrated circuit into which the sensor of the present invention is incorporated. Furthermore, the sensor of the present invention has the least performance impact on the circuit under test and further has special limitations in the design of the circuit which is not under test.

The foregoing objectives, features, functions and advantages of the present invention will be more readily understood upon a thoughtful deliberation of the following detailed description of the embodiments of the present invention in conjunction with the accompanying drawings.

BRIEF DESCRIPTION OF THE DRAWINGS

FIG. 1 shows a circuitry of the intermediate voltage sensor for CMOS circuits of the first preferred embodiment of the present invention.

FIG. 2 shows a circuitry of the intermediate voltage sensor for CMOS circuits of the second preferred embodiment of the present invention.

FIG. 3 shows a circuitry of the intermediate voltage sensor for CMOS circuits of the third preferred embodiment of the present invention.

FIG. 4 shows a functional scheme of the linear inverter which is suitable for use in the present invention.

FIG. 5 shows a functional scheme of the buffer which is suitable for use in the present invention.

DETAILED DESCRIPTION OF THE PREFERRED EMBODIMENTS

As shown in FIG. 1, a built-in intermediate voltage sensor (BIVS1) of the first preferred embodiment comprises the component parts which are described explicitly hereinafter.

A linear inverter has an input end for receiving an input signal under test and further has an output end.

A first positive logic voltage control switch, which is made of the MOS transistor or preferably the NMOS transistor, has an input end, an output end, and a control end. The input end is connected with the output end of the linear inverter while the control end is intended for receiving the input signal under test.

A second positive logic voltage control switch, which is made of the MOS transistor or preferably the NMOS transistor, has an input end, an output end, and a control end. The input end serves to receive the input signal under test while the control end is connected with the output end of the inverter.

A buffer has an input end which is connected with the output end of the first positive logic voltage control switch and the output end of the second positive logic voltage control switch. The buffer is capable of delivering an output.

As shown in FIG. 4, the linear inverter comprises a NMOS transistor and a load which is made up of a PMOS transistor. Both the gate and the drain of the PMOS transistor are connected directly with the drain output end of the NMOS transistor. The inverter has a linear switching characteristic, which is less precipitous. The relationship of the input and the output of the inverter can be expressed by the equation of $V_{out}=V_{DD}-V_{IN}$, in which $V_{IN}$ stands for the input voltage; $V_{out}$, the output voltage; and $V_{DD}$, the power supply voltage When the voltage $V_G$ has logic "0", the positive logic voltage control switch is almost in the open state. On the other hand, when the voltage $V_G$ has logic "1", the positive logic voltage control switch is almost in the short state. $V_G$ stands for the input voltage of the control end of the positive logic voltage control switch, namely, the gate voltage of the MOS transistor.

As shown in FIG. 5, the buffer is made up of two CMOS circuits, which are connected in series and with gates being reversed. The buffer has a precipitous linear switching characteristic.

The buffer is intended to accelerate the sensing speed and to promote the voltage swing. When $V_{IN}$ is greater than $V_{MID}$, the voltage $V_{out}$ has logic "1". On the other hand, when $V_{IN}$ is smaller than $V_{MID}$, the voltage Vout has logic "0". $V_{IN}$ stands for the input voltage of the buffer; $V_{out}$, the output voltage of the buffer; and $V_{MID}$, the intermediate voltage located between logic "0" and logic "1".

As shown in FIG. 1, when the voltage value of an input signal under test is logic "0" or logic "1", the voltage control switch having the input end voltage value of logic "0" is turned on via the inverter so as to cause the input end and the output end of the buffer to have respectively the voltage value of logic "0". When the voltage value of the sensing input end is intermediate between logic "0" and logic "1", both voltage control switches will remain in a state intermediate between logic "0" and logic "1". A voltage having the value of logic "1" is then given forth by the buffer which has a precipitous switching characteristic.

As illustrated in FIG. 2, a built-in intermediate voltage sensor (BIVS2) for CMOS circuits of the second preferred embodiment of the present invention comprises a first linear inverter, a second linear inverter, a negative logic voltage control switch, a load impedance, and a buffer.

The first linear inverter is made up of transistors AP and AN and is provided with an output end and an input end. The input end is used to connect with the input end of an input signal under test.

The second linear inverter is made up of transistors BP and BN and is provided with an output end and an input end. The input end is connected with the output end of the first linear inverter.

The negative logic voltage control switch is composed of PMOS transistor designated as CP. This control switch has an input end which is connected with the output end of the second linear inverter. The control switch further has a control end intended for use in receiving the input signal under test.

The load impedance is made up of a transistor CN and is connected at one end thereof with the output end of the negative logic voltage control switch. The load impedance is further connected at another end thereof with ground (GND).

The buffer has an input end which is connected with the output end of the negative logic voltage control switch and one end of the load impedance. The buffer is capable of giving forth an output.

The inverters of the BIVS2 are similar in function to the inverter of the BIVS1.

When the value of the input voltage $V_G$ of the control end of the negative logic voltage control switch is logic "0", the negative logic voltage control switch is almost in a short state. It must be noted here that the control end input voltage $V_G$ is corresponding to the gate voltage of the MQS transistor.

The load impedance has an electrical characteristic similar to a resistance.

The buffer of the BIVS2 is similar in function to the buffer of the BIVS1.

As illustrated in FIG. 2, when the voltage value of an input signal under test is logic "1", the negative logic voltage control switch CP remains in an open state so as to cause the input voltage and the output voltage of the buffer to have the value of logic "0". When the voltage value of the input signal is logic "0", the outputs of the first inverter and the second inverter are respectively in the logic "1" state and the logic "0" state. In the meantime, the negative logic voltage control switch CP is kept in a short state so as to cause the input voltage and the output voltage of the buffer to have the value of logic "0". When the voltage value of the input signal is intermediate between logic "0" and logic "1", the output voltage values of the first inverter and the second inverter are also in the intermediate state. The negative logic voltage control switch CP is almost in a short state. An output voltage having the value of logic "1" is thus delivered by the buffer which has a precipitous switching characteristic.

As shown in FIG. 3, a built-in intermediate voltage sensor (BIVS3) of the third preferred embodiment of the present invention comprises the component parts, which are described explicitly hereinafter.

A third positive logic voltage control switch is made up of a transistor AN and is provided with an input end which is connected with ground (GND). The third positive logic voltage control switch is further provided with an output end and a control end which is used to receive a negative logic TEST signal.

A first positive logic voltage control switch is made up of the NMOS transistor designated as BN. The first positive logic voltage control switch is provided with an output end, an input end which is connected with the output end of the third positive logic voltage control switch, and a control end which is used to receive an input signal under test.

A second negative logic voltage control switch is made up of the PMOS transistor designated as AP. The control switch AP is provided with an output end, and input end which is connected with the power source($V_{DD}$), and a control end which is used to receive the negative logic TEST signal.

An inverter is provided with an output end and an input end which is connected with the output end of the first positive logic voltage control switch and the output end of the second negative logic voltage control switch.

A first negative logic voltage control switch is made up of the PMOS transistor, which is designated as BP. This control switch BP has an output end, an input end which is connected with the output end of the inverter, and a control end which is connected with the input signal.

A second positive logic voltage control switch is made up of the NMOS transistor designated as CN, The control switch CN has an output end, an input end which is connected with ground (GND), and a control end which is used to receive a positive logic TEST signal.

A buffer has an input end which is connected with the output end of the first negative logic voltage control switch and the output end of the second positive logic voltage control switch. The buffer is capable of giving forth an output.

Being opposite in characteristic to the linear inverter of the BIVS1 of the present invention, the inverter of the BIVS3 has a much more precipious switching characteristic that a common CMOS inverter has. The positive logic voltage control switch of the BIVS3 is similar in function to that of the BIVS1 of the present invention. The negative logic voltage control switch of the BIVS3 is similar in function to that of the BIVS2 of the present invention. The buffer of the BIVS3 is similar in function to that of the BIVS1 of the present invention.

As shown in FIG. 3, the transistors AP and CN are used to precharge and predischarge the potentials of $V_{O1}$ and $V_{O3}$ while the transistor AN is intended to isolate $V_{O1}$ so as to prevent the grounding from taking place when the precharging is under way. The transmission transistors BN and BP are used to sense the input signal under test. Before the process of sensing the input signal under test is initiated, the TEST signal must be first set at logic "1" so as to enable the sensor of the present invention to phase into an initialization phase, in which $V_{O1}$ and $V_{O3}$ are initialized to logic "1" and logic "0", respectively. Thereafter, the TEST signal is set at logic "0" so as to enable the sensor of the present invention to phase into an evaluation phase. If the voltage value of the input signal is logic "1", the transistor BP is turned off so as to cause $V_{O3}$ to remain at logic "0". As a result, the values of the input voltage and the output voltage of the buffer are logic "0" respectively. If the voltage value of the input signal is logic "0", the transistor BN is turned off so as to cause $V_{O1}$ to remain at logic "1". In the meantime, $V_{O2}$ is set at logic "0" via the inverter so as to cause the input voltage and the output voltage of the buffer to have respectively the value of logic "0". When the voltage value of the sensed input end is intermediate between logic "0" and logic "1", the two voltage control switches (transistors BN and BP) are in an intermediate state between logic "0" and logic "1". As a result, $V_{O1}$ is pulled down while $V_{O2}$ and $V_{O3}$ are pulled high, In the meantime, an output signal having the voltage value of logic "1" is given forth by the buffer which has a precipitous switching characteristic.

The embodiments of the present invention described above are to be regarded in all respects as merely illustrative and not restrictive. Accordingly the present invention may be embodied in other specific forms without deviating from the spirit thereof. The present invention is therefore to be limited only by the scope of the following appended claims.

What is claimed is:

1. An intermediate voltage sensor for CMOS circuits comprising:

a linear inverter having an output end and an input end which is connected with an input signal under test;

a first voltage control switch provided with a control end which is connected with said input end of said linear inverter, said first voltage control switch further provided with an input end which is connected with said output end of said linear inverter;

a second voltage control switch provided with a control end which is connected with said output end of said linear inverter, said second voltage control switch further provided with an input end which is connected with said input end of said linear inverter; and a buffer being opposite in characteristic to said linear inverter and having a precipitous switching characteristic, said buffer provided with an input end which is connected with an output end of said first voltage control switch and an output end of said second voltage control switch;

wherein said buffer is capable of giving forth an output voltage having a first logic value when said input signal has a voltage value of logic "0" or logic "1"; and wherein said buffer is capable of giving forth an output voltage having a second logic value when said input signal has a voltage value intermediate between said logic "0" and said logic "1", with said second logic value being different from said first logic value.

2. The sensor as defined in claim 1, wherein said first voltage control switch and said second voltage control switch are respectively a positive logic voltage control switch.

3. The sensor as defined in claim 2, wherein said first voltage control switch and said second voltage control switch are respectively an MOS transistor.

4. The sensor as defined in claim 3, wherein said first voltage control switch and said second voltage control switch are respectively an NMOS transistor.

5. The sensor as defined in claim 1, wherein said linear inverter comprises an NMOS transistor and a load made up of a PMOS transistor, said PMOS transistor having a gate and a drain which are connected directly with an output end of a drain of said NMOS transistor.

6. The sensor as defined in claim 1, wherein said buffer is composed of two CMOS circuits which are connected in series, with gates thereof being reversed.

7. The sensor as defined in claim 1, wherein said first logic value and said second logic value are respectively "0" and "1".

8. An intermediate voltage sensor for CMOS circuits comprising:

a first linear inverter having an output end and an input end which is connected with an input signal under test;

a second linear inverter having an output end and input end which is connected with said output end of said first linear inverter;

a voltage control switch having a control end, an input end and an output end, with said control end being connected with said input end of said first linear inverter, and with input end being connected with said output end of said second linear inverter; and a buffer being opposite in characteristic to said first linear inverter and said second linear inverter such that said buffer having a precipitous switching characteristic, said buffer provided with an input end which is connected with said output end of said voltage control switch;

wherein said buffer is capable of giving forth an output voltage having a first logic value when said input signal has a voltage value of logic "0" or logic "1"; and wherein said buffer is capable of giving forth another output voltage having a second logic value when said input signal has a voltage value intermediate between said logic "0" and said logic "1", with said second logic value being different from said first logic value.

9. The sensor as defined in claim 8, wherein said voltage control switch is a negative logic voltage control switch.

10. The sensor as defined in claim 8, wherein said voltage control switch is a PMOS transistor.

11. The sensor as defined in claim 8, wherein said first linear inverter and said second linear inverter comprise respectively an NMOS transistor and a load which is made up of a PMOS transistor, with said PMOS transistor having a gate and a drain which are connected directly with an output end of a drain of said NMOS transistor.

12. The sensor as defined in claim 8, wherein said buffer is composed of two CMOS circuits which are connected in series, with gates thereof being reversed.

13. The sensor as defined in claim 8, wherein said first logic value and said second logic value are respectively "0" and "1".

14. An intermediate voltage sensor for CMOS circuits comprising:

a first positive logic voltage control switch having an output end and a control end which is connected with an input signal under test;

an inverter having an output end and an input end which is connected with said output end of said first positive logic voltage control switch a first negative logic voltage control switch having an output end, an input end which is connected with said output end of said inverter, and a control end which is connected with said input signal under test; and a buffer having a precipitous switching characteristic and provided with an input end which is connected with output end of said first negative logic voltage control switch;

wherein said buffer is capable of giving forth an output voltage having a first logic value when said input signal has a voltage value of logic "0" or logic "1"; and wherein said buffer is further capable of giving forth another output voltage having a second logic value when said input signal has a voltage value intermediate between said logic "0" and said logic "1".

15. The sensor as defined in claim 14 further comprising:

a second negative logic voltage control switch provided with a control end and an input end, with said control end being connected with a negative logic test signal (TEST), and with said input end being connected with a power supply signal ($V_{DD}$), said second negative logic voltage control switch further provided with an output end which is connected with said input end of said inverter for providing said input end of said inverter with a precharge potential; and a second positive logic voltage control switch having a control end, an input end and an output end, with said control end being connected with a positive logic test signal (TEST), with said input end being connected with a ground end, and with said output end being connected with said input end of said buffer for providing said input end of said buffer with a predischarge potential.

16. The sensor as defined in claim 15, wherein said inverter is a CMOS inverter.

17. The sensor as defined in claim 15, wherein said first positive logic voltage control switch and said second positive logic voltage control switch are respectively an NMOS transistor; and wherein said first negative logic voltage control switch and said second negative logic voltage control switch are respectively a PMOS transistor.

18. The sensor as defined in claim 14, wherein said buffer is composed of two CMOS circuits which are connected in series, with gates thereof being reversed.

19. The sensor as defined in claim 14, wherein said first logic value and said second logic value are respectively "0" and "1".

* * * * *